US007016258B2

United States Patent
Lim

(10) Patent No.: US 7,016,258 B2
(45) Date of Patent: Mar. 21, 2006

(54) SEMICONDUCTOR DEVICE HAVING INPUT/OUTPUT SENSE AMPLIFIER FOR MULTIPLE SAMPLING

(75) Inventor: Kyu-nam Lim, Yongin-si (KR)

(73) Assignee: Samsung Electronics, Co., Ltd., (KR)

( * ) Notice: Subject to any disclaimer, the term of this patent is extended or adjusted under 35 U.S.C. 154(b) by 30 days.

(21) Appl. No.: 10/916,179

(22) Filed: Aug. 11, 2004

(65) Prior Publication Data
US 2005/0088882 A1    Apr. 28, 2005

(30) Foreign Application Priority Data
Oct. 28, 2003  (KR)  ............... 10-2003-0075633

(51) Int. Cl.
*G11C 8/00* (2006.01)
(52) U.S. Cl. .............. 365/233; 365/205; 365/208
(58) Field of Classification Search ............... None
See application file for complete search history.

(56) References Cited

U.S. PATENT DOCUMENTS 5,007,024 A * 4/1991 Tanaka et al. ............. 365/207
5,386,389 A * 1/1995 Taoka ..................... 365/230.06
5,594,695 A * 1/1997 Yim et al. ................. 365/205
6,031,769 A * 2/2000 Kim ......................... 365/194

* cited by examiner

*Primary Examiner*—Son Mai
(74) *Attorney, Agent, or Firm*—Mills & Onello, LLP

(57) ABSTRACT

Provided is a semiconductor device that is insensitive to a change in a power supply voltage, inconsistencies in a manufacturing process, and a change in temperature and provides for a rapid read data operation. The semiconductor device includes a first read signal generator, a second read signal generator, and a voltage input/output sense amplifier. The first read signal generator generates a first read signal for sampling data in response to an enable signal of a column selection line. The second read signal generator generates a second read signal including a plurality of pulses during an enabling period of the first read signal in response to the first read signal. The voltage input/output sense amplifier receives a data value output from a memory cell, amplifies the data value in synchronization with the column selection line, and samples the data value in synchronization with enabling signals of the second read signal.

13 Claims, 8 Drawing Sheets

SEMICONDUCTOR DEVICE HAVING INPUT/OUTPUT SENSE AMPLIFIER FOR MULTIPLE SAMPLING

CROSS REFERENCE TO RELATED APPLICATION

This application claims the priority of Korean Patent Application No. 2003-75633, filed on Oct. 28, 2003, in the Korean Intellectual Property Office, the disclosure of which is hereby incorporated by reference in its entirety.

BACKGROUND OF THE INVENTION

1. Field of the Invention

The present invention relates to a semiconductor device, and more particularly, to a semiconductor device that is insensitive to a change in a voltage, circuit dimension or temperature, and provides for a rapid read data operation.

2. Description of the Related Art

With the demand for semiconductor devices with increased speed, clock frequencies of the semiconductor devices increase and time intervals between signals decrease.

Also, as the amount of time necessary for data read and write operations decreases, more accurate data read and write operations are required.

In particular, in the case of semiconductor devices, a sufficient time margin between a read signal and a sampling signal is required to amplify a data signal to a required voltage. However, the margin may change with a power supply voltage or temperature. Thus, if the time intervals are set sufficiently large in consideration of a change in the power supply voltage or temperature, the overall data read time and data write time increase.

FIG. 1 illustrates a conventional data input/output (IO) sense amplifier (S/A) 100.

The data IO S/A 100 includes a voltage IO S/A 101, a first read signal (FRP) generator 102, and a tri-state driver controller 103.

Small signal data SGIO and /SGIO output from a memory cell (not shown) are input to the voltage IO S/A 101. The voltage IO S/A 101 amplifies the small signal data SGIO and /SGIO to data IO and /IO that are sufficiently large to be outputs of a complementary metal-oxide semiconductor (CMOS) voltage level, samples the amplified data in synchronization with an FRP, and outputs the sampled data.

The FRP generator 102 receives an external clock signal CLK, generates the FRP, and outputs the FRP to the voltage IO S/A 101 and the tri-state driver controller 103.

The sampled data IO and /IO output from the voltage IO S/A 101 are input to the tri-state driver controller 103, and the tri-state driver controller 103 outputs pull-up data PU and pull-down data PD that are then output to an external device as a data output signal DOUT.

In such a conventional voltage IO S/A, an absolute time margin that facilitates a successful data read operation with just one sampling operation is required.

FIG. 2 is a timing diagram illustrating a conventional method of driving the voltage IO S/A 101.

Once a column selection line CSL is enabled, the small signal data SGIO and /SGIO are amplified. If the small signal data SGIO and /SGIO are amplified to an amplitude of about 100 mV so as to be accurately read, the FRP is enabled and the small signal data SGIO and /SGIO are sampled once in synchronization with the FRP.

In the voltage IO S/A 101 of FIG. 2, since the data read operation should be successful with one sampling operation as described above, an absolute time margin between an enable signal of the column selection line CSL and an enable signal of the FRP is required. This sufficient margin should be large enough to amplify the small signal data SGIO and /SGIO to a sufficient amplitude (about 100 mV). If sampling is performed when the time delay between the column selection line CSL and the FRP is small and the small signal data SGIO and /SGIO are amplified to less than the sufficient amplitude, the data read operation may fail.

However, in semiconductor devices, characteristics of the sufficient margin are very sensitive to changes in a process, a power supply voltage and temperature (PVT). For example, if a power supply voltage VDD increases, the time delay between the column selection line (CSL) and the FRP decreases.

FIG. 3 is a graph illustrating a change in a margin between the column selection line (CSL) and the FRP with respect to a power supply voltage.

Referring to FIG. 3, as the power supply voltage VDD increases, the time interval required to enable the column selection line (CSL) decreases. More specifically, the column selection line (CSL) is enabled in 9.033 ns when the power supply voltage VDD is 1.6V and is enabled in 5.378 ns when the power supply voltage VDD is 2.5V. Also, as the power supply voltage VDD increases, the time interval required to enable the FRP decreases. More specifically, the FRP is enabled in 12.284 ns when the power supply voltage VDD is 1.6V and is enabled in 7.221 ns when the power supply voltage VDD is 2.5V.

Also, as the power supply voltage VDD increases, the margin between the column selection line CSL and the FRP decreases. When the power supply voltage VDD is 1.6V, the margin is about 3.251 ns. However, when the power supply voltage VDD increases to 2.5V, the margin decreases to 1.843 ns.

TABLE 1

| VDD (V) | CSL (ns) | FRP (ns) | Margin (ns) |
|---|---|---|---|
| 1.6 | 9.033 | 12.284 | 3.251 |
| 1.7 | 8.285 | 11.264 | 2.979 |
| 1.8 | 7.645 | 10.352 | 2.707 |
| 1.9 | 7.128 | 9.657 | 2.529 |
| 2.0 | 6.670 | 9.023 | 2.353 |
| 2.1 | 6.397 | 8.616 | 2.219 |
| 2.2 | 6.071 | 8.152 | 2.081 |
| 2.3 | 5.807 | 7.785 | 1.978 |
| 2.4 | 5.592 | 7.506 | 1.914 |
| 2.5 | 5.378 | 7.221 | 1.843 |

It can be seen from Table 1 that the margin between the column selection line CSL and the FRP decreases as the power supply voltage VDD increases. In this case, if the sufficient margin is secured at a high voltage, a semiconductor device operates at a proper speed at a high voltage, but the margin between the column selection line CSL and the FRP unnecessarily increases at a low voltage. As a result, a speed of the data read operation in the semiconductor device decreases according to the increase in the margin.

On the other hand, if the sufficient margin is only secured at a low voltage, the semiconductor device operates at a proper speed and flawlessly reads data at a low voltage, but a sufficient time delay between the column selection line (CSL) and the FRP is not secured at a high voltage. As a result, an error may occur in the data read operation.

FIG. 4 is a timing diagram illustrating the operation of the conventional voltage IO S/A 101 when the power supply voltage is increased.

Referring to FIG. 4, a margin 401 between the column selection line CSL and the FRP at a low voltage is greater than a margin 402 between them at a high voltage. Thus, if the characteristics of the sufficient margin is based on a low voltage, the small signal data SGIO and /SGIO are amplified to a voltage 403 sufficient to read data over the margin 401. However, at a high voltage, the small signal data SGIO and /SGIO are amplified to a voltage 404 that is insufficient to read data. In this case, an error may occur in the data read operation.

The margin between the enable signal of the column selection line CSL and the enable signal of the FRP signal may change as a result of an inconsistent circuit dimension (CD). Inconsistencies in the circuit dimension occur due to an error in the length of a transistor formed during a semiconductor device manufacturing process or due to a circuit length difference between memory cells to voltage IO S/A 101.

TABLE 2

| CD VAR (um) | CSL (ns) | FRP (ns) | MARGIN (ns) |
|---|---|---|---|
| 0.04 | 9.897 | 13.647 | 3.750 |
| 0.03 | 9.728 | 13.361 | 3.633 |
| 0.02 | 9.445 | 12.966 | 3.251 |
| 0.01 | 9.239 | 12.554 | 3.315 |
| 0 | 9/033 | 12.284 | 3.251 |
| −0.01 | 8.880 | 12.032 | 3.152 |
| −0.02 | 8.594 | 11.675 | 3.081 |
| −0.03 | 8.353 | 11.356 | 3.003 |
| −0.04 | 8.122 | 10.968 | 2.846 |

It can be seen from Table 2 that the time delay between the column selection line CSL and the FRP decreases as the circuit dimension CD decreases.

Thus, if the sufficient margin is based on a small circuit dimension, the amount of time required for the data read operation unnecessarily increases in a large circuit dimension. Furthermore, if the sufficient margin is based on a large circuit dimension, an error may occur in the data read operation in a short circuit dimension.

SUMMARY OF THE INVENTION

The present invention provides a semiconductor device including a sense amplifier that can stably read data regardless of a change in a temperature of, a voltage applied to, or a circuit dimension of the semiconductor device.

The present invention also provides a semiconductor device including a sense amplifier that can rapidly read data regardless of a temperature of, a voltage applied to, or a circuit dimension of the semiconductor device.

According to an aspect of the present invention, there is provided a semiconductor device comprising a first read signal generator, which generates a first read signal for sampling data in response to an enable signal of a column selection line; a second read signal generator, which generates a second read signal with a plurality of pulses during an enabling period of the first read signal in response to the first read signal; and a voltage input/output sense amplifier, which receives a data value output from a memory cell, amplifies the data value in synchronization with the column selection line, and samples the data value in synchronization with enabling signals of the second read signal.

The semiconductor device can further comprise a data determining unit. When data is sampled a plurality of times in synchronization with the pulses of the second read signal, if a current sample of data is different from a previous sample of data, the data determining unit can discard the previous sample of data and determine the current sample of data to be data stored in the memory cell.

The data determining unit can compare a number of times that each data value is sampled and determine a value of sampled data occurring with a largest percentage to be data stored in the memory cell.

The second pulse generator can generate the second read signal having two pulses during one enabling period of the first read signal. In the voltage input/output sense amplifier, a predetermined voltage can be set to an intermediate value of an operating voltage range of the semiconductor device, wherein data is sampled in response to the first pulse of the second read signal generated during one enabled period of the first read signal when a voltage lower than the predetermined voltage is applied to the voltage input/output sense amplifier, and the data is sampled in response to the second pulse of the second read signal generated during one enabled period of the first read signal when a voltage higher than the predetermined voltage is applied to the voltage input/output sense amplifier.

The semiconductor device can further comprise a data determining unit, which determines data sampled in response to the second pulse of the second read signal to be data stored in the memory cell if the data sampled in response to the first pulse of the second read signal is different from the data sampled in response to the second pulse.

In one embodiment, the second read signal generator is distributed over a column decoder layer or an input/output sense amplifier area of the semiconductor device.

According to another aspect of the present invention, there is provided a method of reading data with a semiconductor device. The method comprises generating a first read signal for sampling data in response to an enable signal of a column selection line; generating a second read signal with a plurality of pulses during an enabling period of the first read signal in response to the first read signal; receiving a data value output from a memory cell and amplifying the data value in synchronization with the column selection line; sampling the data value in synchronization with enabling signals of the second read signal; comparing the data sampled a plurality of times, and determining data stored in a memory cell.

In one embodiment, the determination of the data stored in the memory cell comprises: sampling data a plurality of times in synchronization with the pulses of the second read signal; discarding a previous data sample; and determining a current data sample to be the data stored in the memory cell if the previous data sample and the current data sample are not the same.

In one embodiment, the determination of the data stored in the memory cell comprises: comparing a number of times that each data value is sampled; and determining a data value occurring with the largest percentage to be the data stored in the memory cell.

Generation of the second read signal can include generating two pulses of second read signals during one enabling period of the first read signal. In one embodiment, the sampling of data comprises: setting a predetermined voltage to an intermediate value of an operating voltage range of the semiconductor device; sampling data in response to the first pulse of the second signal generated during one enabled period of first read signal when a voltage lower than the predetermined voltage is applied; and sampling the data in response to the second pulse of the second read signal generated during one enabled period of the first read signal when a voltage higher than the predetermined voltage is applied. In one embodiment, the determination of the data comprises: determining the data sampled in response to the second pulse of the second read signal generated during one enable period of the first read signal to be data stored in the memory cell if the data sampled in response to the first pulse of the second read signal generate during one enable period of the first read signal is different from the data sampled in response to the second pulse.

BRIEF DESCRIPTION OF THE DRAWINGS

The above and other aspects and advantages of the present invention will become more apparent by describing in detail an exemplary embodiment thereof with reference to the attached drawings.

DETAILED DESCRIPTION OF THE INVENTION

Figure 1:
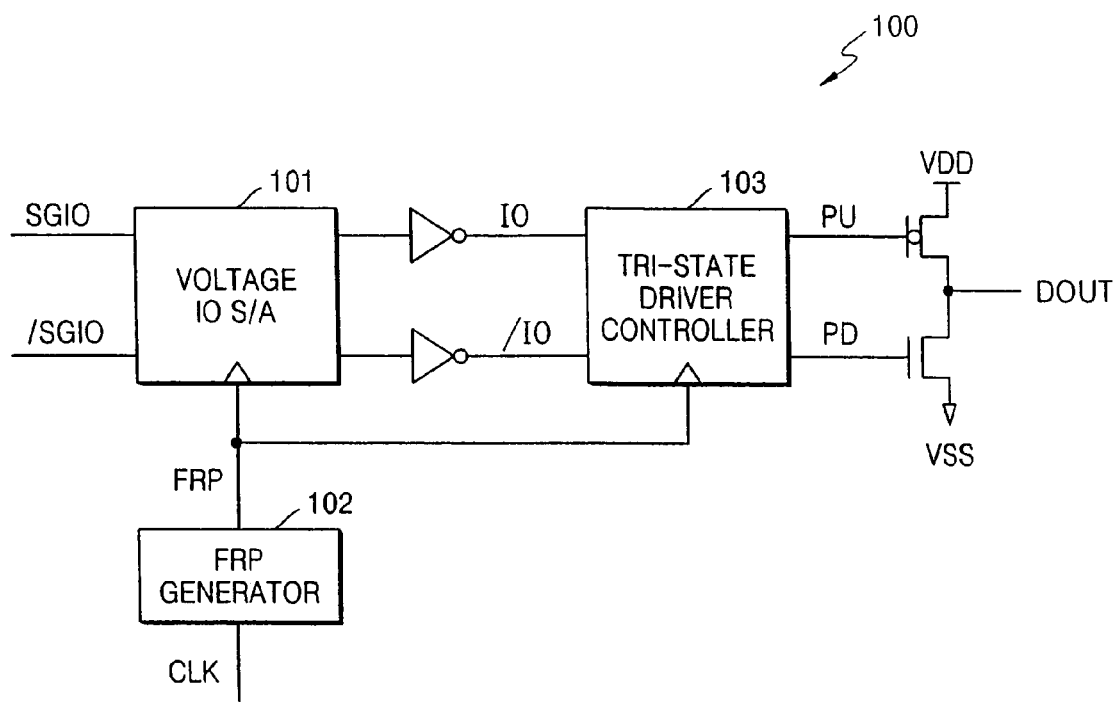
FIG. 1 illustrates a conventional data input/output (IO) sense amplifier (S/A).
Figure 2:
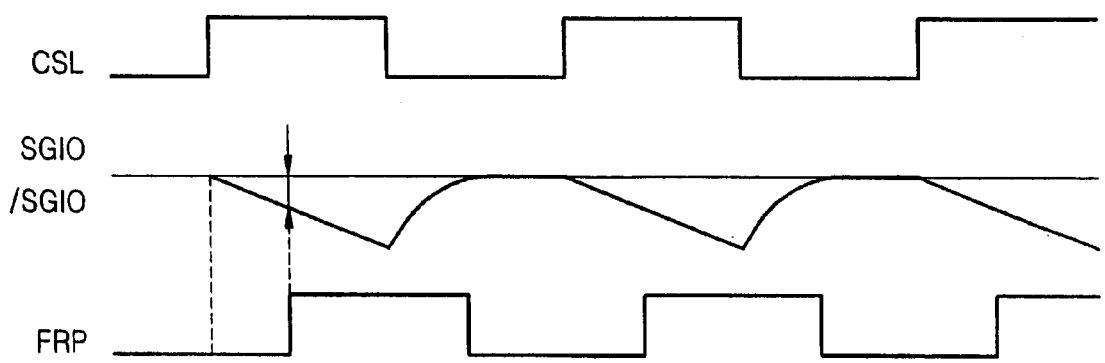
FIG. 2 is a timing diagram illustrating a conventional a method of driving the conventional data IO S/A of FIG. 1.
Figure 3:
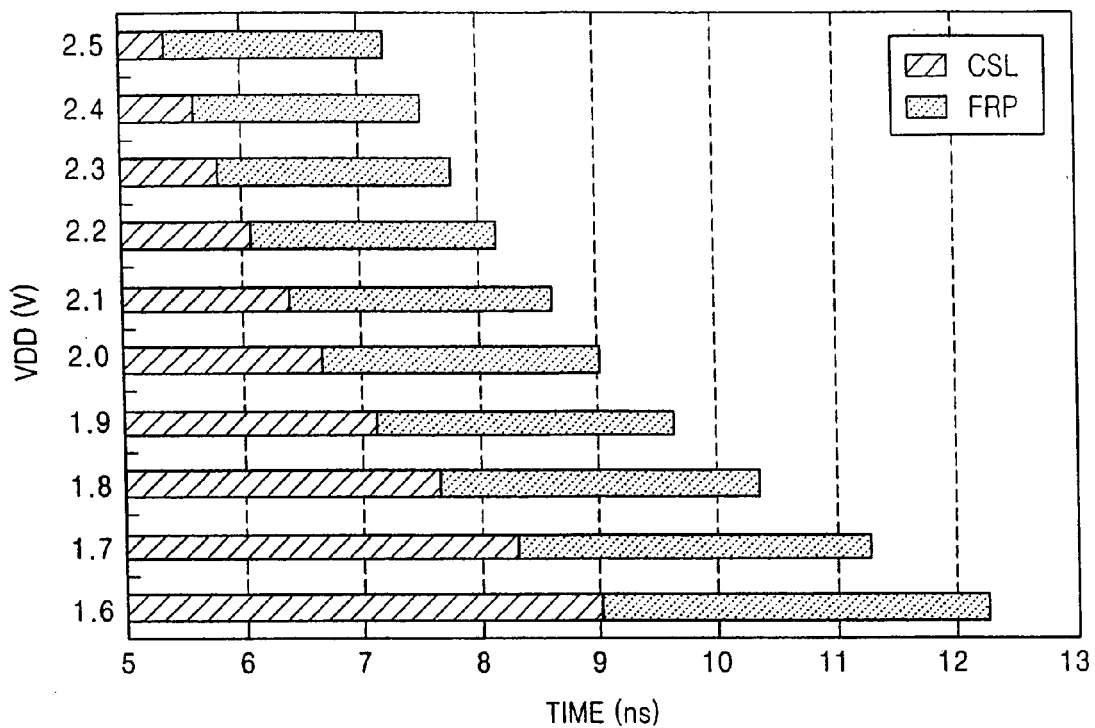
FIG. 3 is a graph illustrating a change in a margin between a column selection line and a first read signal (FRP) with respect to a power supply voltage.
Figure 4:
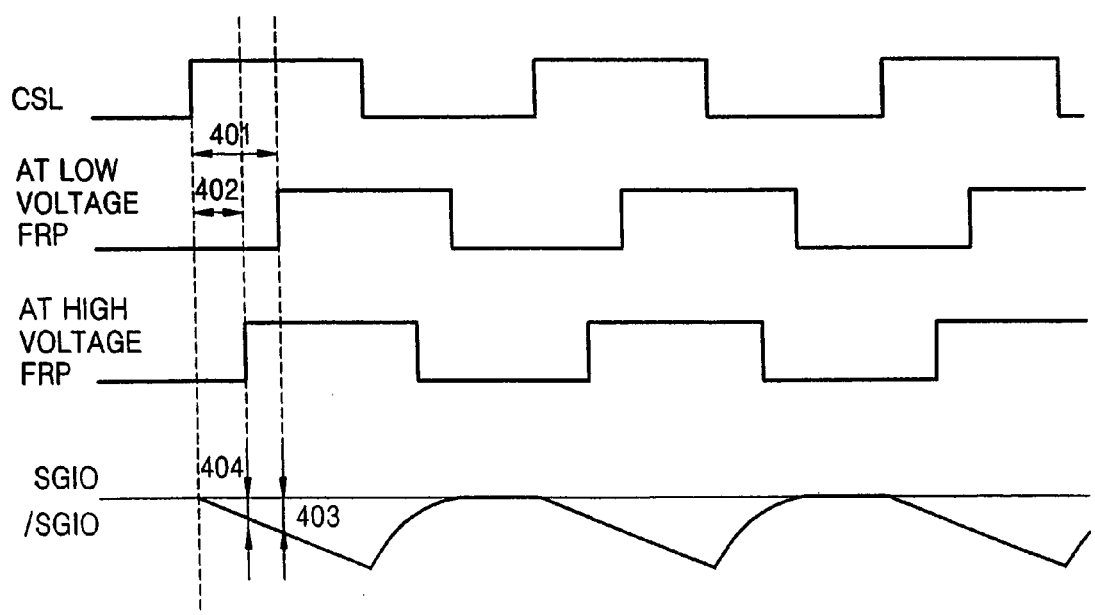
FIG. 4 is a timing diagram illustrating an operation of the conventional data IO S/A of FIG. 1 when the power supply voltage is increased.

The present invention will now be described more fully with reference to the accompanying drawings, in which exemplary embodiments of the invention are shown. Throughout the drawings, like reference numerals are used to refer to like elements.

Figure 5:
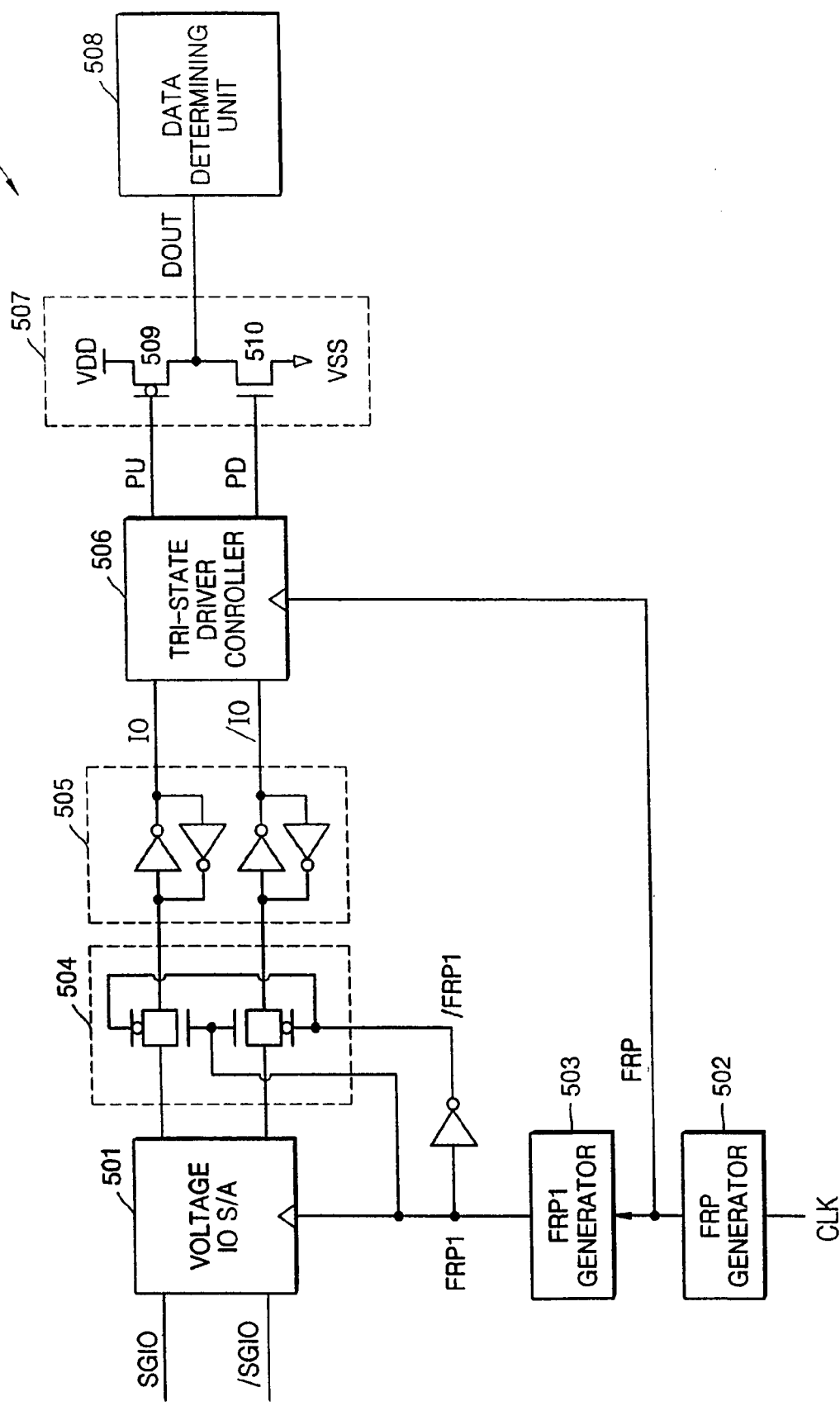
FIG. 5 illustrates a data output circuit of a semiconductor device according to a first exemplary embodiment of the present invention.

FIG. 5 illustrates a data output circuit 500 of a semiconductor device according to a first exemplary embodiment of the present invention. The data output circuit 500 shown in FIG. 5 is a type of wave pipeline processor. As the operating speed of semiconductor devices increases, a column address strobe (CAS) latency increases. To implement a long CAS latency between 5 and 6 in a semiconductor device that operates at a high speed, a data output circuit that is a type of wave pipeline processor is widely used.

Referring to FIG. 5, the data output circuit 500 includes a voltage input/output (IO) sense amplifier (S/A) 501, a first read signal (FRP) generator 502, a second read signal (FRP1) generator 503, a transmission circuit 504, a latch circuit 505, a tri-state driver controller 506, an output data buffer 507, and a data determining unit 508.

Small signal data SGIO and /SGIO output from a memory cell array are amplified by the voltage IO S/A 501. The voltage IO S/A 501 also samples data in synchronization with a second read signal FRP1 and outputs the sampled data. The FRP1 generator 503 receives a first read signal FRP from the FRP generator 502 and generates the second read signal FRP1 with a plurality of pulses during when the first read signal FRP is enabled.

The transmission circuit 504 transmits data IO and /IO output from the voltage IO S/A 501, to the latch circuit 505 in response to an inverted second read signal /FRP1, and the latch circuit 505 latches signals output from the transmission circuit 504. The data IO and /IO are output from the latch circuit 505 and input to the tri-state driver controller 506.

The tri-state driver controller 506 outputs pull-up data PU and pull-down data PD in response to the data IO and /IO and the first data read signal FRP.

The output data buffer 507 includes a pull-up transistor 509 and a pull-down transistor 510. The pull-up transistor 509 and the pull-down transistor 510 drive output data DOUT to supply voltage VDD or ground voltage in response to the pull-up data PU and the pull-down data PD.

The tri-state driver controller 506 receives the first read signal FRP as a tri-state control signal. If the FRP is at a logic low level, the pull-up data PU is maintained at a logic low and the pull-down data PD is maintained at a logic high, regardless of the logic level of the data IO. Thus, both the pull-up transistor 509 and the pull-down transistor 510 of the output data buffer 507 are turned off and the output data DOUT enters a hi-impedance state or tri-state.

However, if the FRP is at a logic high level, both the pull-up data PU and the pull-down data PD depend on the logic level of the data IO. Thus, one of the pull-up transistor 509 and the pull-down transistor 510 of the output data buffer 507 is turned on, and the output data DOUT has a high or low logic level.

The output data DOUT output from the output data buffer 507 is input to the data determining unit 508. The data determining unit 508 compares data sampled during an enabling period of the second read signal FRP1, during which the second read signal FRP1 is enabled, or reads data sampled during a predetermined enabling period as actual data of a memory cell.

Figure 6:
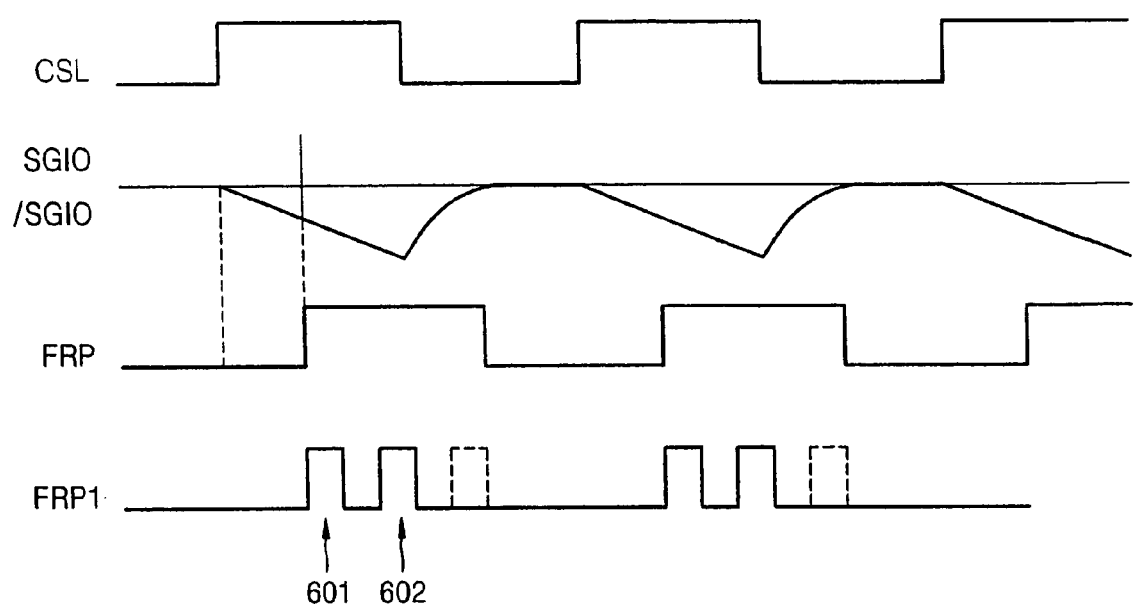
FIG. 6 is a timing diagram illustrating a method of driving a voltage IO S/A according to a second exemplary embodiment of the present invention.

FIG. 6 is a timing diagram illustrating a method of driving the voltage IO S/A 501 according to a second exemplary embodiment of the present invention.

Referring to FIG. 6, the first and second read signals FRP and FRP1 are signals used to sample the small signal data SGIO and /SGIO read from the memory cell. The second read signal FRP1 includes a plurality of pulses which have a period less than a period of a pulse of the FRP. The second read signal FRP1 is generated in response to the first read signal and at least two pulses of the second read signal FRP1 are generated during the enabling period of the first read signal FRP. The number of enabling periods, the timing of enabling, and the interval between enabled pulses may vary.

Referring to FIGS. 5 and 6, if the column selection line CSL is enabled, amplification of the small signal data SGIO and /SGIO begins. The first read signal FRP is enabled when a voltage of the small signal data SGIO and /SGIO has a predetermined value. However, data is not sampled in direct synchronization with the first read signal FRP. The second read signal FRP1 generated by the FRP1 generator 503 in response to the first read signal FRP is input to the voltage IO S/A 501. Thus, the small signal data SGIO and /SGIO are sampled a number of times in synchronization with the second read signal FRP1.

For example, the small signal data SGIO and /SGIO output from the memory cell are sampled once in synchronization with the first read signal FRP in a conventional voltage IO S/A. However, in the voltage IO S/A 501 according to the first exemplary embodiment of the present invention, when data is read once, multiple sampling can be performed. Thus, data that is sampled a majority of times can be determined to be actual data stored in a memory cell array.

Even if a first pulse 601 of the second read signal FRP1 is generated before the small signal data SGIO and /SGIO are sufficiently amplified, a second or third of the second read signal FRP1 602 is generated after a sufficient period such that the small signal data SGIO and /SGIO are amplified sufficiently for an error not to occur. As a result, it is possible to accurately read data. That is, when data sampled in synchronization with the first pulse of the second read signal FRP1 is different from data sampled in synchronization with the second pulse 602 of the second read signal FRP1, the data sampled in synchronization with the first pulse 601 is discarded and the data sampled in synchronization with the second pulse 602 is accepted.

In this case, although a time delay between a column selection line CSL and the first read signal FRP changes with temperature of a semiconductor device or the length of a transistor, it is possible to accurately read data.

Figure 7A:
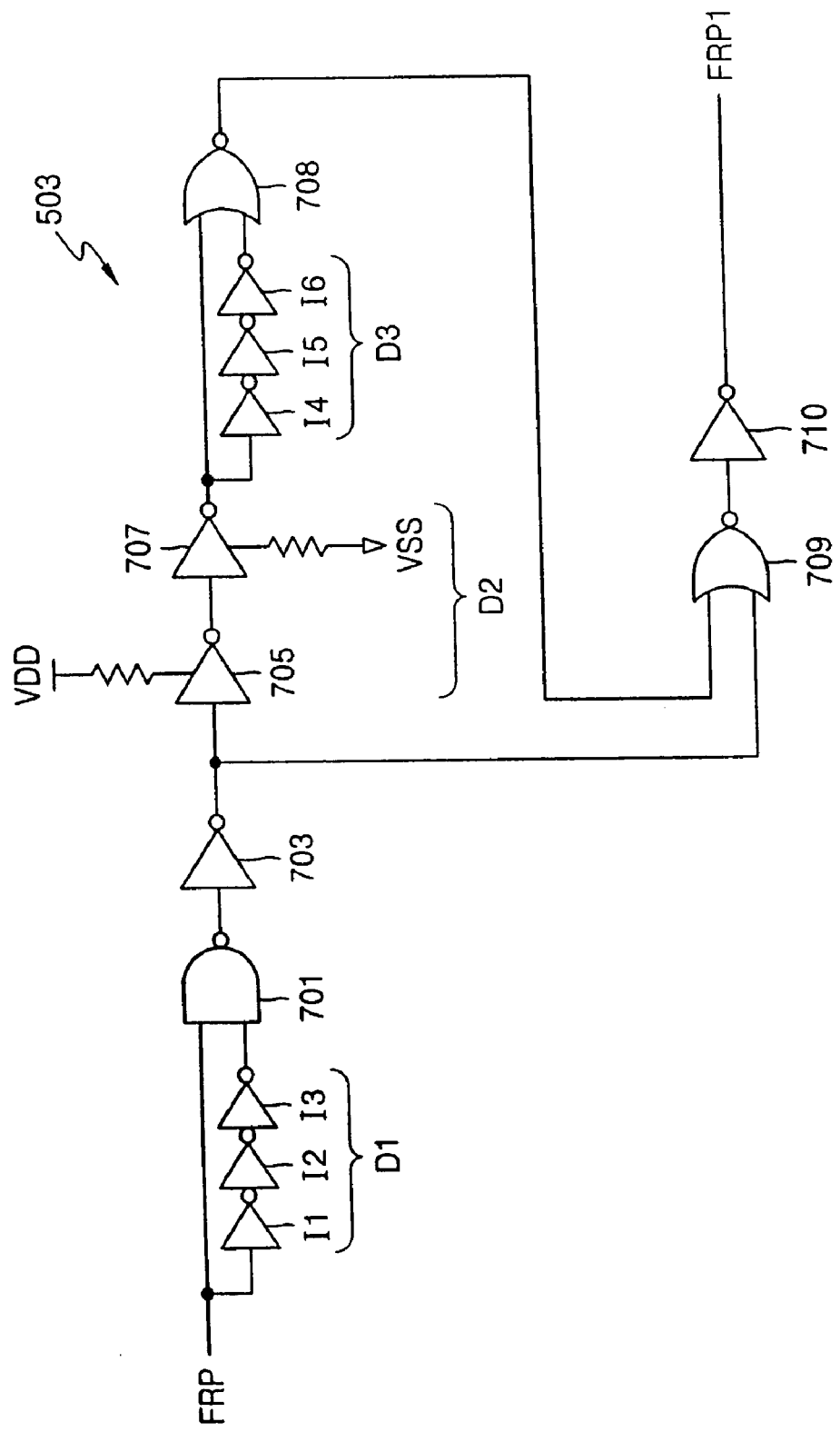
FIG. 7A is a circuit diagram of a second read signal generator of the data output circuit of FIG. 5.

FIG. 7A is a circuit diagram of the FRP1 generator 503.

The FRP1 generator 503 includes delay circuits D1 and D3 that determine the width of each enabling pulse of the second read signal FRP1 and a delay circuit D2 that determines an interval between the enabling pulses.

Referring to FIG. 7A, the first read signal FRP is input to the FRP1 generator 503. The input FRP is input to the delay circuit D1 in which a plurality of inverters I1 through I3 are connected in series. An output signal of the inverters I1 through I3 and the first read signal FRP are input to a NAND gate 701. An output signal of the NAND gate 701 is input to an inverter circuit 703. An output signal of the inverter circuit 703 is input to the delay circuit D2 that determines the interval between enabling pulses. The delay circuit D2 includes an even number of inverter circuits 705 and 707. An output signal of the delay circuit D2 is input to the delay circuit D3, which includes a plurality of inverters I4 through I6. The signals output from the delay circuits D2 and D3 are output to the NOR gate 708. The output signals of the delay circuit D2 and the NOR gate 708 are input to a NOR gate 709, and the second read signal FRP1 is generated and output from a final inverter 710.

Figure 7B:
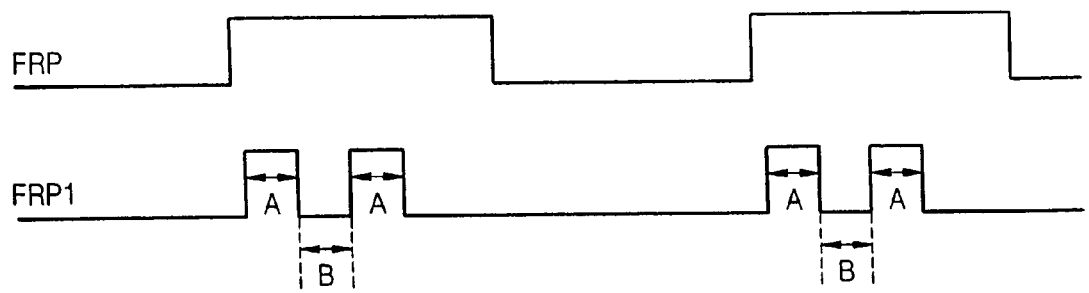
FIG. 7B is a timing diagram of a first read signal FRP and a second read signal FRP1 selectively generated by a FRP generator and the FRP1 generator of FIG. 7A.

FIG. 7B is a timing diagram of the first and second read signals FRP and FRP1 respectively generated by the FRP generator 502 and the FRP1 generator 503 of FIG. 7A.

Referring to FIG. 7B, the second read signal FRP1 is only generated during the enabling period of the FRP. That is, data is only sampled in synchronization with the first read signal FRP as in the prior art. The second read signal FRP1 generated by the FRP1 generator 503 is generated with two consecutive pulses, with an enabling period A and a delay B before a second enabling period.

Figure 8:
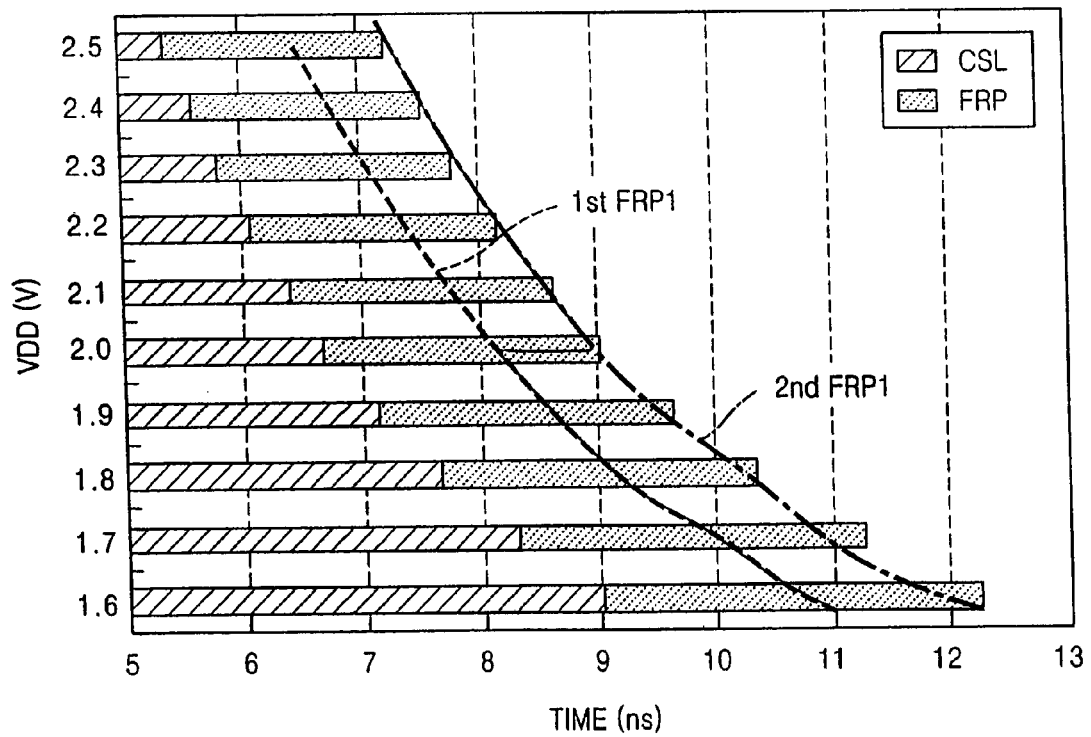
FIG. 8 is a graph for explaining data sampling with respect to a change in the power supply voltage applied to the data output circuit of FIG. 5.

FIG. 8 is a graph illustrating data sampling with respect to a change in the power supply voltage VDD applied to the data output circuit of FIG. 5.

Referring to FIG. 8, it is assumed that two pulses of the second read signal FRP1 are generated during one enabling period of the first read signal FRP. The first pulse of the second read signal FRP1 is expressed as a dashed line and the second pulse of the second read signal FRP1 is expressed as a non-uniformly dashed line. As with the first read signal FRP generated in the prior art, the margin between the column selection line CSL and the second read signal FRP1 decreases as the power supply voltage VDD increases. That is, the interval between the time when the column selection line CSL is enabled and the time when the small signal data SGIO and /SGIO read from a memory cell array are amplified decreases as the power supply voltage VDD increases.

In this case, when the power supply voltage VDD is small, such that the margin between the column selection line CSL and the second read signal FRP1 is relatively large, data sampled in synchronization with an enable signal of the first pulse of the second read signal FRP1 can be accepted. When the power supply voltage VDD is large, in which case the margin is relatively small, data sampled in synchronization with an enable signal of the second pulse of the second read signal FRP1 can be accepted.

Thus, since data is read according to the first pulse of the second read signal FRP1 at a low voltage, it is possible to avoid unnecessary wastes in timing. Also, since data is read according to the enabling signal of the second pulse of the second read signal FRP1 at a high voltage, the small signal data SGIO and /SGIO is amplified sufficiently to be read when the second pulse of the second read signal FRP1 is generated, even if the small signal data SGIO and /SGIO output from the memory cell array do not have such sufficient timings to be amplified when the FRP is enabled. As a result, data can be read properly. That is, it is possible to accurately sample data of the change in the power supply voltage VDD.

Also, when three pulses of the second read signal FRP1 are generated during the enabling period of the first read signal FRP, data is sampled based on the change in the power supply voltage VDD. That is, data is sampled in synchronization with the enabling signal of the first pulse of the second read signal FRP1 at a low voltage, in synchronization with the enabling signal of the second pulse of the second read signal FRP1 at an intermediate voltage, and in synchronization with the enabling signal of the third pulse of the second read signal FRP1 at a high voltage. Thus, it is possible to accurately sample data regardless of the change in the power supply voltage VDD and prevent unnecessary timing delays from occurring between the column selection line CSL and the first read signal FRP at a low voltage when compared to one sampling of data in synchronization with the first read signal FRP in the prior art. Also, at a high voltage, a sufficient delay is secured between the column selection line CSL and the pulse of the second read signal FRP1 that is used, thereby preventing an error from occurring in a data read operation.

Also, when at least three pulses of the second read signal FRP1 are generated during one enabling period of the first read signal FRP, data can be sampled a number of times during the enabling period of the first read signal FRP, the sampled data are compared, and data that is sampled most frequently is determined to be actual data stored in the memory cell. Thus, it is possible to determine an error in data sampling due to insufficient amplification of the small signal data SGIO and /SGIO.

According to the present invention, in contrast to a conventional method in which a plurality of sampling circuits are included in one voltage IO S/A and a number of samplings are performed, it is possible to avoid unnecessarily large delays when a sufficient margin is set. Thus, even if only one data sample circuit can be included in a voltage IO S/A due to characteristics of a semiconductor memory device, it is still possible to perform multiple data sampling.

Also, it is possible to accurately read data regardless of a change in the power supply voltage VDD and the differences in lengths of transistors included in a semiconductor device. That is, according to the change in the length of the transistor, it is possible to determine which the pulse of the second read signal FRP1 data sampling is to be synchronized with or perform multiple data sampling during the enabling period of the first read signal FRP using the plurality of pulses of the second read signal FRP1, thereby preventing an error in data sampling.

Furthermore, even when the interval between pulses changes with ambient temperature of the semiconductor device, a sufficient margin between the column selection line and the read signal can be set. Thus, it is possible to rapidly read data without an error in a data read operation.

The FRP1 generator 503 may be disposed adjacent to the FRP generator 502. That is, the FRP generator 502 and the FRP1 generator 503 may be formed in a peri-layer, i.e., an area other than where a cell block, a column decoder, and an S/A are formed. Also, the FRP1 generator 503 can be distributed over a column decoder layer or respective areas where a group of S/As is formed.

Figure 9A:
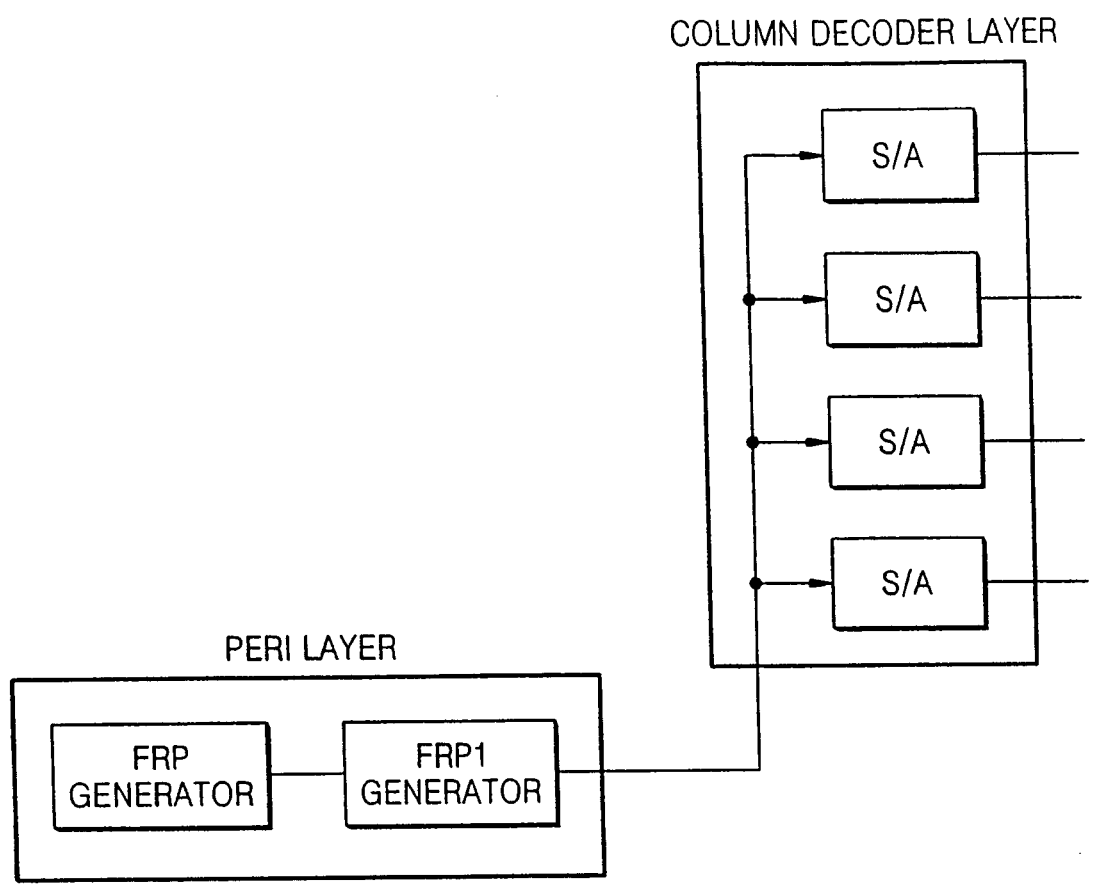
FIGS. 9A and 9B illustrate possible arrangements of the FRP1 generator of FIG. 7A.
Figure 9B:
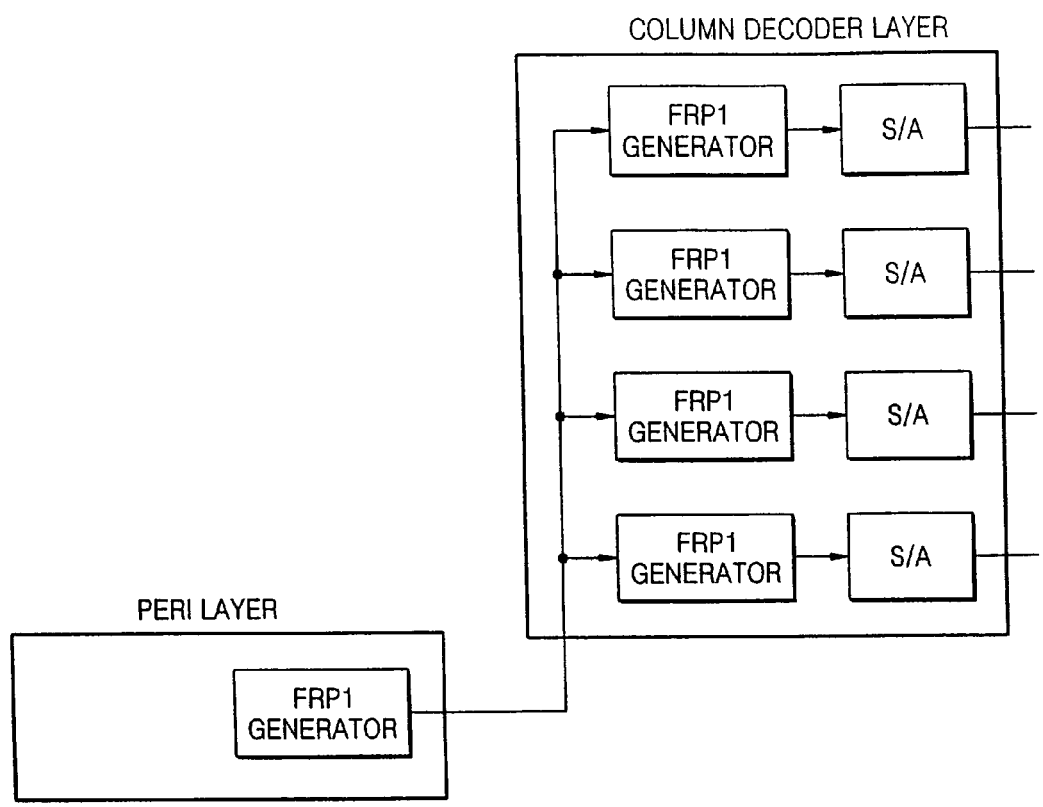

FIGS. 9A and 9B illustrate possible arrangements of the FRP1 generator 503 of FIG. 7A.

When the FRP1 generator 503 is distributed over areas as shown in FIG. 9B, it can have a smaller width than when it is disposed in one area as shown in FIG. 9A. Thus, it is possible to more finely and accurately sample data.

In the semiconductor device according to the present invention, it is possible to stably and rapidly read data regardless of a change in a temperature of, a voltage applied to, or circuit dimension of a semiconductor device.

Also, multiple data sampling can be performed using one voltage IO S/A that can sample data while data is read once. Also, it is possible to sample data a plurality of times while data is read once, thereby preventing an error in a data read operation.

While the present invention has been particularly shown and described with reference to exemplary embodiments thereof, it will be understood by those of ordinary skill in the art that various changes in form and details may be made therein without departing from the spirit and scope of the invention as defined by the appended claims and their equivalents.

What is claimed is:

1. A semiconductor device comprising:
   a first read signal generator, which generates a first read signal for sampling data in response to an enable signal of a column selection line;
   a second read signal generator, which generates a second read signal with a plurality of pulses during an enabling period of the first read signal in response to the first read signal; and
   a voltage input/output sense amplifier, which receives a data value output from a memory cell, amplifies the data value in synchronization with the column selection line, and samples the data value in synchronization with enabling signals of the second read signal.

2. The semiconductor device of claim 1, further comprising a data determining unit, wherein, when data is sampled a plurality of times in synchronization with the pulses of the second read signal, if a current sample of data is different from a previous sample of data, the data determining unit discards the previous sample of data and determines the current sample of data to be data stored in the memory cell.

3. The semiconductor device of claim 1, further comprising a data determining unit that compares a number of times that each data value is sampled and determines a value of sampled data occurring with a largest percentage to be data stored in the memory cell.

4. The semiconductor device of claim 1, wherein the second pulse generator generates the second read signal having two pulses during one enabling period of the first read signal.

5. The semiconductor device of claim 4, wherein in the voltage input/output sense amplifier, a predetermined voltage is set to an intermediate value of an operating voltage range of the semiconductor device, wherein data is sampled in response to the first pulse of the second read signal generated during one enabled period of the first read signal when a voltage lower than the predetermined voltage is applied to the voltage input/output sense amplifier, and the data is sampled in response to the second pulse of the second read signal generated during one enabled period of the first read signal when a voltage higher than the predetermined voltage is applied to the voltage input/output sense amplifier.

6. The semiconductor device of claim 4, further comprising a data determining unit, which determines data sampled in response to the second pulse of the second read signal to be data stored in the memory cell if the data sampled in response to the first pulse of the second read signal is different from the data sampled in response to the second pulse.

7. The semiconductor device of claim 1, wherein the second read signal generator is distributed over a column decoder layer or an input/output sense amplifier area of the semiconductor device.

8. A method of reading data with a semiconductor device, the method comprising:
   generating a first read signal for sampling data in response to an enable signal of a column selection line;
   generating a second read signal with a plurality of pulses during an enabling period of the first read signal in response to the first read signal;
   receiving a data value output from a memory cell and amplifying the data value in synchronization with the column selection line;
   sampling the data value in synchronization with enabling signals of the second read signal;
   comparing the data sampled a plurality of times, and determining data stored in a memory cell.

9. The data read method of claim 8, wherein the determination of the data stored in the memory cell comprises: sampling data a plurality of times in synchronization with the pulses of the second read signal; discarding a previous data sample; and determining a current data sample to be the data stored in the memory cell if the previous data sample and the current data sample are not the same.

10. The method of claim 8, wherein the determination of the data stored in the memory cell comprises: comparing a number of times that each data value is sampled; and determining a data value occurring with the largest percentage to be the data stored in the memory cell.

11. The method of claim 8, wherein the generation of the second read signal comprises generating two pulses of second read signals during one enabling period of the first read signal.

12. The method of claim 11, wherein the sampling of data comprises: setting a predetermined voltage to an intermediate value of an operating voltage range of the semiconductor device; sampling data in response to the first pulse of the second signal generated during one enabled period of first read signal when a voltage lower than the predetermined voltage is applied; and sampling the data in response to the second pulse of the second read signal generated during one enabled period of the first read signal when a voltage higher than the predetermined voltage is applied.

13. The method of claim 11, wherein the determination of the data comprises: determining the data sampled in response to the second pulse of the second read signal generated during one enable period of the first read signal to be data stored in the memory cell if the data sampled in response to the first pulse of the second read signal generate during one enable period of the first read signal is different from the data sampled in response to the second pulse.

* * * * *